United States Patent
Kishi et al.

[11] Patent Number: 5,939,891
[45] Date of Patent: Aug. 17, 1999

[54] SOCKET FOR IC PACKAGE

[75] Inventors: Nobuaki Kishi; Masanori Takagishi; Ichiro Matsuo, all of Oganomachi, Japan

[73] Assignee: Chichibu Fuji Co., Ltd., Saitama-ken, Japan

[21] Appl. No.: 08/831,056

[22] Filed: Apr. 1, 1997

[30] Foreign Application Priority Data

Dec. 26, 1996 [JP] Japan .................................. 8-348647

[51] Int. Cl.$^6$ .................................................. H01R 11/22
[52] U.S. Cl. .......................................................... 324/755
[58] Field of Search .................................... 324/755, 758, 324/765, 761; 257/723, 40, 48; 439/266, 33, 68, 72, 73, 264, 152, 525, 372, 101

[56] References Cited

U.S. PATENT DOCUMENTS

| | | | |
|---|---|---|---|
| 4,993,955 | 2/1991 | Savant | 439/266 |
| 5,045,923 | 9/1991 | Matsuoka | 439/266 |
| 5,147,212 | 9/1992 | Uratsuji et al. | 439/266 |
| 5,195,903 | 3/1993 | Uratsuji | 439/266 |
| 5,244,404 | 9/1993 | Kishi et al. | 439/331 |
| 5,326,271 | 7/1994 | Kishi et al. | 439/72 |
| 5,334,036 | 8/1994 | Matsuoka | 439/266 |
| 5,364,284 | 11/1994 | Tohyama et al. | 439/266 |
| 5,387,118 | 2/1995 | Kishi et al. | 439/266 |
| 5,395,260 | 3/1995 | Hayakawa et al. | 439/266 |
| 5,431,579 | 7/1995 | Kishi et al. | 439/266 |
| 5,461,258 | 10/1995 | Ideta et al. | 257/723 |
| 5,683,262 | 11/1997 | Matsuoka et al. | 439/266 |
| 5,700,155 | 12/1997 | Matsuoka | 439/266 |

FOREIGN PATENT DOCUMENTS

| | | |
|---|---|---|
| 63-299257 | 12/1988 | Japan . |
| 4-12624 | 3/1992 | Japan . |
| 5152392 | 6/1993 | Japan . |

OTHER PUBLICATIONS

An English Language Abstract of JP 63-299257.

*Primary Examiner*—Vinh P. Nguyen
*Attorney, Agent, or Firm*—Greenblum & Bernstein P.L.C.

[57] ABSTRACT

A new socket is provided for testing an IC package whereby the contact parts of the contacts are moved outward to be able to conduct attachment and detachment of an IC package without a load, the oxide film formed on the contacts of the IC package is removed to acquire a reliable conductivity, and a stress to deform the contacts of the IC package cannot be exerted. In the socket, the contact parts of the contacts come into contact with the contacts of the IC package while sliding outward (in the opposite direction to the receiving space for the IC package), and remove the oxide films on the surfaces of the IC contacts to secure a reliable conductivity. When the IC package is taken out, the contact parts of the contacts move outward, the supporting point moves inward by the swing of the engaging member; and thereby, the contact parts of the contacts go up virtually vertically in the initial state of the movement, and afterward, move oblique outward to come off from the contacts of the IC package. Thus, the load to the contacts of the IC package can be reduced to so low a level as possible.

4 Claims, 8 Drawing Sheets

FIG. 10(a)
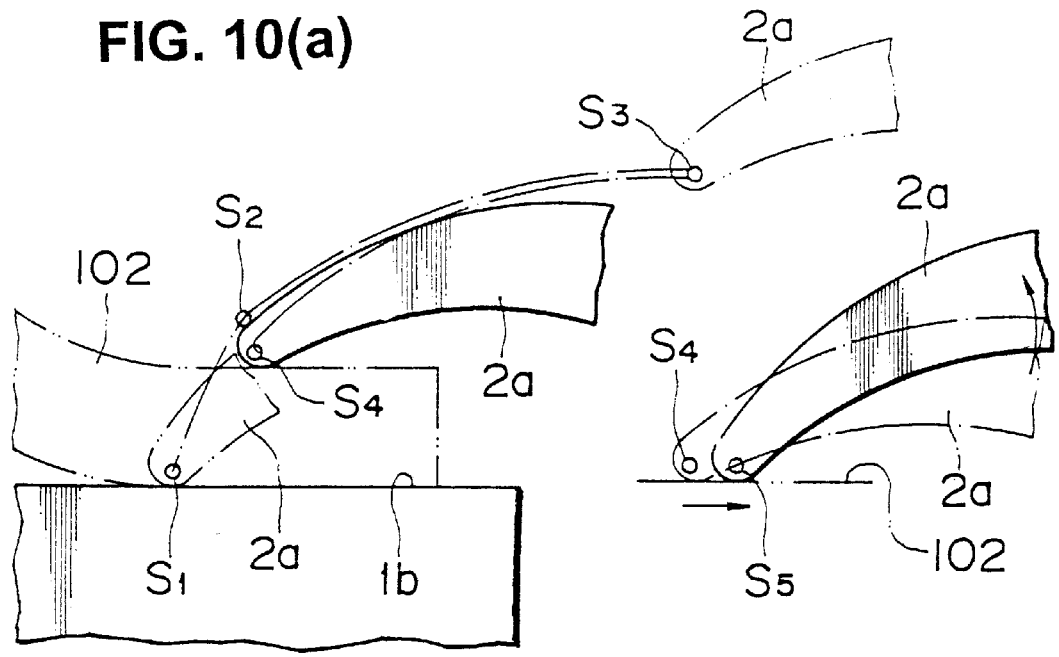
FIG. 10(b)
FIG. 11
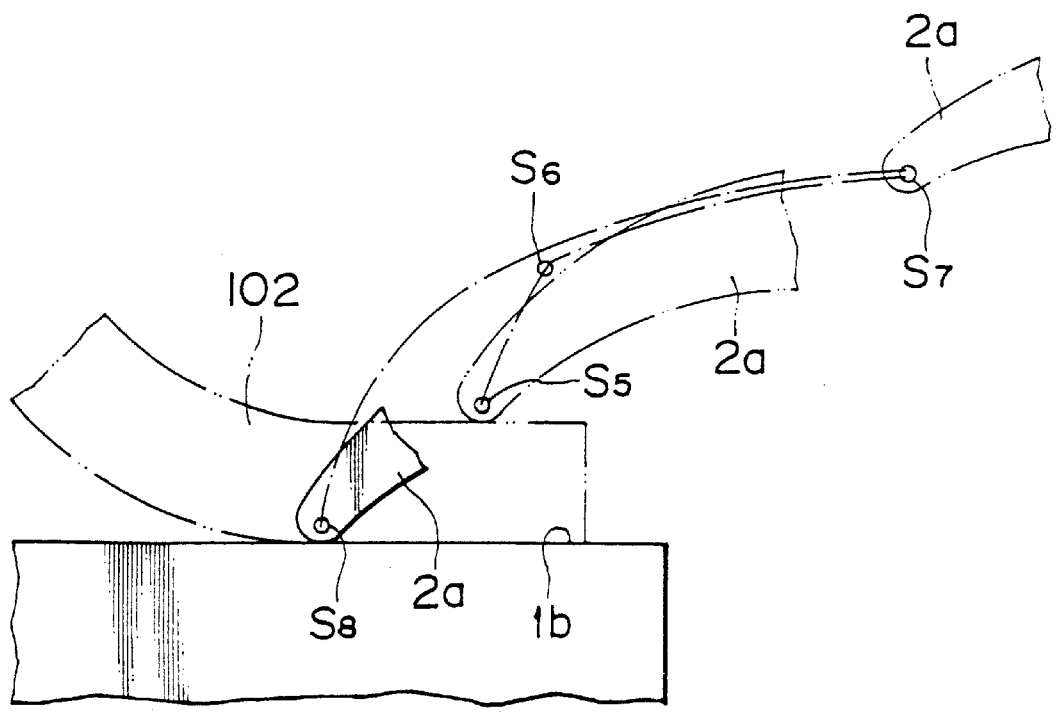

SOCKET FOR IC PACKAGE

BACKGROUND OF THE INVENTION

1. Field of the Invention

The present invention relates to a socket for testing non-defective or defective of an IC package manufactured.

2. Description of the Prior Art

Sockets of various constructions have been proposed which are provided with a plurality of contact members detachable to contacts of an IC package, mounted on a base member, whereby pushing down a desirable member can move the contact members outward so as to detach the IC package without a load.

There has been disclosed a socket for IC inspection, for example, in the Japanese Patent Laid-open No. Sho 63-299257, which is provided with contact pins having a base inserted into the socket body, movable pieces extending out from the base through an elastic curvature, and contact pieces branching out in the opposite direction from the movable pieces and pressing lead terminals by elasticity of the elastic curvature, and release means being in contact with the movable pieces and capable of releasing the contact pieces from pressing the lead terminals.

As another example, a socket for testing IC devices has been disclosed in the Japanese Patent Publication No. Hei 4-12624, which is provided with a clamp swingable between a closed position adjoining to an upper side of a base and an open position extending outward on the upper side of the base, an energizing member for energizing the clamp to the closed position, and contacts attached on the clamp, laterally extending.

A socket assembly has been disclosed in the Japanese Patent Laid-open No. Hei 5-152392, which is provided with arms that have a plurality of contact elements disposed along two arms of a support flame and can be swung vertically as means to move contact parts with IC devices in the contact elements, and cam members that have cam projections for giving outward forces to the contact elements.

However, a detailed examination of the foregoing conventional sockets will reveal the following problems.

In case of the construction as disclosed in Japanese Patent Laid-open No. Sho 63-299257, the contact piece a of the contact pin slidingly comes into contact with the lead terminal b while moving from the outward part of the lead terminal b to the inward part thereof.

In other words, the contact piece a goes upward on the slope b1 in the bent area of the lead terminal b and increases scratches, which will lead to scrape a surface plating on the lead terminal b and will easily produce plating scraps c. The plating scraps will fall down and remain on a base d on which the lead terminal b is mounted, and adhere to lead terminals of an IC package mounted next, which gives a possibility leading to deformations and/or electric faults of the foregoing lead terminals (refer to FIG. 12).

The socket according to the Japanese Patent Publication No. Hei 4-12624 has a construction in which the contact moves virtually horizontally to slidingly come into contact with a lead of an IC. As the clamp moves from the open position to the closed position after the IC is mounted on the upper side of the base, the contact slidingly comes into contact with the lead of the IC moving from the outside to the inside. Since the IC is set upside down, the aforementioned troubles do not occur. However, since the contact moves from the outside to the inside, a stress to press the lead of the IC inward (toward the IC body) is exerted, and consequently, a potential problem of a deformed lead remains.

In the socket according to the Japanese Patent Laid-open No. Hei 5-152392, on the other hand, the cam projection moves the contact part outward against the resiliency of the elastic part of the contact element, when the arm is swung downward. To go into the details, the cam projection swings the contact part upward, and the contact part does not slide of scrape on the lead of the IC; and therefore, plating scraps are not produced and the lead is not deformed as described above. However, an oxide film formed on the lead of the IC will exert an influence on a reliable conductivity between the contact part and the lead of the IC. Therefore, in such a construction, the contact pressure to the lead of the IC by the contact part is necessary to be increased (resiliency of the elastic part is increased), which, however, shortens the life of the contact element as well as deteriorates maneuverability to swing the arm downward.

SUMMARY OF THE INVENTION

The present invention has been made in view of the foregoing problems, and it is an object of the present invention to provide, in a socket for an IC package whereby the IC package can be attached or detached without a load by moving the contact parts of a plurality of the contacts synchronously outwardly, a new socket for an IC package whereby the contact pressure between the contacts of the IC package and the contact parts of the contact can be reduced to a comparably low level, the oxide film formed on the contacts can be removed to make a reliable conductivity, and a stress to deform the contact will not possibly be exerted.

In order to accomplish the aforementioned object, the socket for an IC package according to the present invention as claimed in claim 1 is characterized in that, along side arms of a base member having a receiving space for the IC package, a plurality of contacts, each of which has a contact part corresponding to a contact of the IC package received in the receiving space for the IC package and a spring part for giving a contact pressure with the foregoing contact of the IC package to the foregoing contact part, are disposed in parallel, and engaging members for engaging with the foregoing contacts provided outside of both columns of the foregoing contacts are swingably supported, whereby the contact parts of the foregoing contacts move outward against resiliency of the spring parts so as to come off from the contacts of the IC package as the foregoing engaging members are swung outward by pushing down a cover for overlaying the base member.

Further, each of the engaging members has a supporting point movable within a play, about which the engaging member can be swung.

Each of the foregoing contacts is provided with an operating rod extending out downward from outer end of the contact part, and the operating rod is loose fitted into a recessed part formed on the engaging member so as to be vertically slidable.

When the cover is pushed down to swing the engaging member outward, the supporting point moves inward and the recessed part presses the operating rod inward to energize the contact part inward. On the other hand, when the engaging member is swung inward to bring the contact part into contact with the contact of the IC package, the energizing force to have pressed the operating rod inward is released to slide the contact part outward.

The foregoing engaging member is swingably supported about the supporting point which is movable within a play, and various supporting structures for the engaging member can be proposed.

An example is such that a cam shaft projecting out of both the right and left sides of the engaging member is rotatably supported on a receiving part provided in a specific position on the base member. This case is preferable, because the direction for which the engaging member is swung and the direction for which the supporting point is moved can be controlled comparably easily.

Furthermore, a more concrete construction for the foregoing cam shaft and the receiving part is such that the cam shaft is projected out on both the right and left sides of the lower part of the engaging member and the cam shaft is inserted into a receiving part recessed on the outer rim of the base member; or the cam shaft is projected out on both the right and left sides of the lower or middle high part of the engaging member and a receiving part is formed on an arm extended downward from the upper part of the base member and the foregoing cam shaft is inserted into the foregoing receiving part from the upper part or from the side so as to hang the engaging member.

The shape of the recessed part formed on the engaging member may be a groove, through hole, or recession, as long as the operating rod provided on the foregoing contact can be loose fitted so as to be vertically slidable.

In the construction formed as in claim 1, when the cover is not pressed, the contact part of the contact is given a contact pressure with the contact of the IC package and the supporting point of the engaging member is at an outer position (refer to FIG. 4).

When the cover is pressed downward from this state, the engaging member swings outward and the contact part of the contact moves outward against the resiliency of the spring part so as to come off from the contact of the IC package. At that moment, the supporting point moves inward, and the inward movement of the supporting point and the outward swing of the engaging member makes the recessed part to press the operating rod inward (toward the receiving space) to energize the contact part inward (refer to FIGS. 5 and 6).

Further at that moment, when the contact part moves outward as the engaging member swings outward, the contact part goes up virtually vertically in the initial movement as the supporting point moves from the outer position P1 to the inner position P2 (refer to FIG. 5). And next, the engaging member swings about the inner position P2 of the supporting point, whereby the contact part moves oblique upward outward to come off from the contact of the IC package (refer to FIG. 6).

When the pushing-down operation of the cover is released from after the IC package is received in the receiving space with the contact part come off outward, the engaging member is swung inward by the resiliency of the spring part of the contact to recover the initial state, and the contact part comes into contact with the contact of the IC package. After the contact part comes into contact with the contact of the IC package, the operating rod goes up inside the recessed part and the pressing force by the recessed part is released, the contact part slides outward (return to the initial position), and the sliding by the contact part scrapes down the oxide film formed on the surface of the contact of the IC package. And at that moment, since the operating rod is already released from being pressed by the recessed part, the contact part will not slide inward, when the cover is pressed down next (refer to FIG. 7).

After a conductivity test is done in the foregoing state, the contact part of the contact is spaced from the contact of the IC package by pushing down the cover to take out the IC package. When the contact part moves outward, the contact part goes up virtually vertically in the initial movement as described above, and afterward, goes oblique upward to come off from the contact of the IC package (refer to FIGS. 8 and 9).

Thus, in the socket according to claim 1, the contact part of the contact comes into contact with the contact of the IC package so as to slide outward (in the opposite direction to the IC package). Therefore, the oxide film formed on the surface of the IC contact is scraped off and a reliable conductivity can be secured and the contact pressure (resiliency of the spring part) to the IC contact by the contact part is not needed to increase. Furthermore, when the contact part of the contact is moved outward in order to take out the IC package, a pressure to slide the contact part inward (in the direction of the IC package body) is not exerted, and in addition, the contact part comes off from the IC contact such that the contact part goes up virtually vertically and then moves oblique upward. Accordingly, the load to the IC contact can be reduced to so low a level as ever possible, and the IC contact will not be deformed and the plating scraps will not possibly be produced.

The outward slide of the contact part when the foregoing engaging member swings inward and the contact part comes into contact with the IC contact to release the foregoing pressure is desirable to accompany a slight swing of the contact part.

In this case, a slight slide can remove an oxide film on the surface of the IC contact to secure a reliable conductivity; and therefore, the contact pressure to the IC contact by the contact part is sufficient with a lower level.

BRIEF DESCRIPTION OF THE DRAWINGS

FIGS. 10(a) and 10(b) are enlarged drawings parts showing a state that the contact part is dislocated;

FIG. 11 is an enlarged drawing of important parts showing another state that the contact part is dislocated;

DESCRIPTION OF THE PREFERRED EMBODIMENT

One example of preferred embodiments of a socket for an IC package relating to the present invention will now be described with reference to the accompanying drawings.

Figure 1:
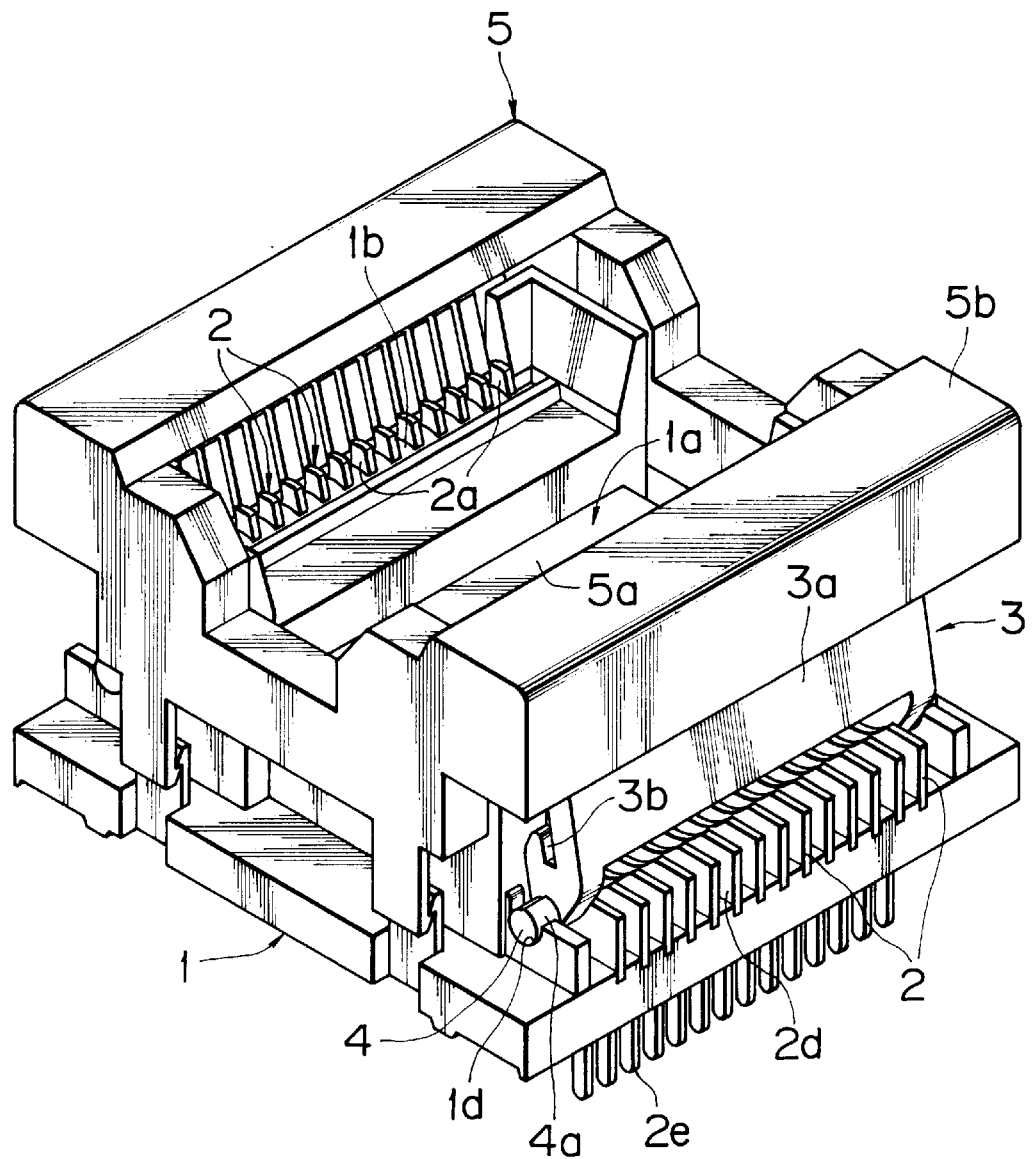
FIG. 1 is a perspective view showing one example of preferred embodiments of a socket for an IC package relating to the present invention.
Figure 2:
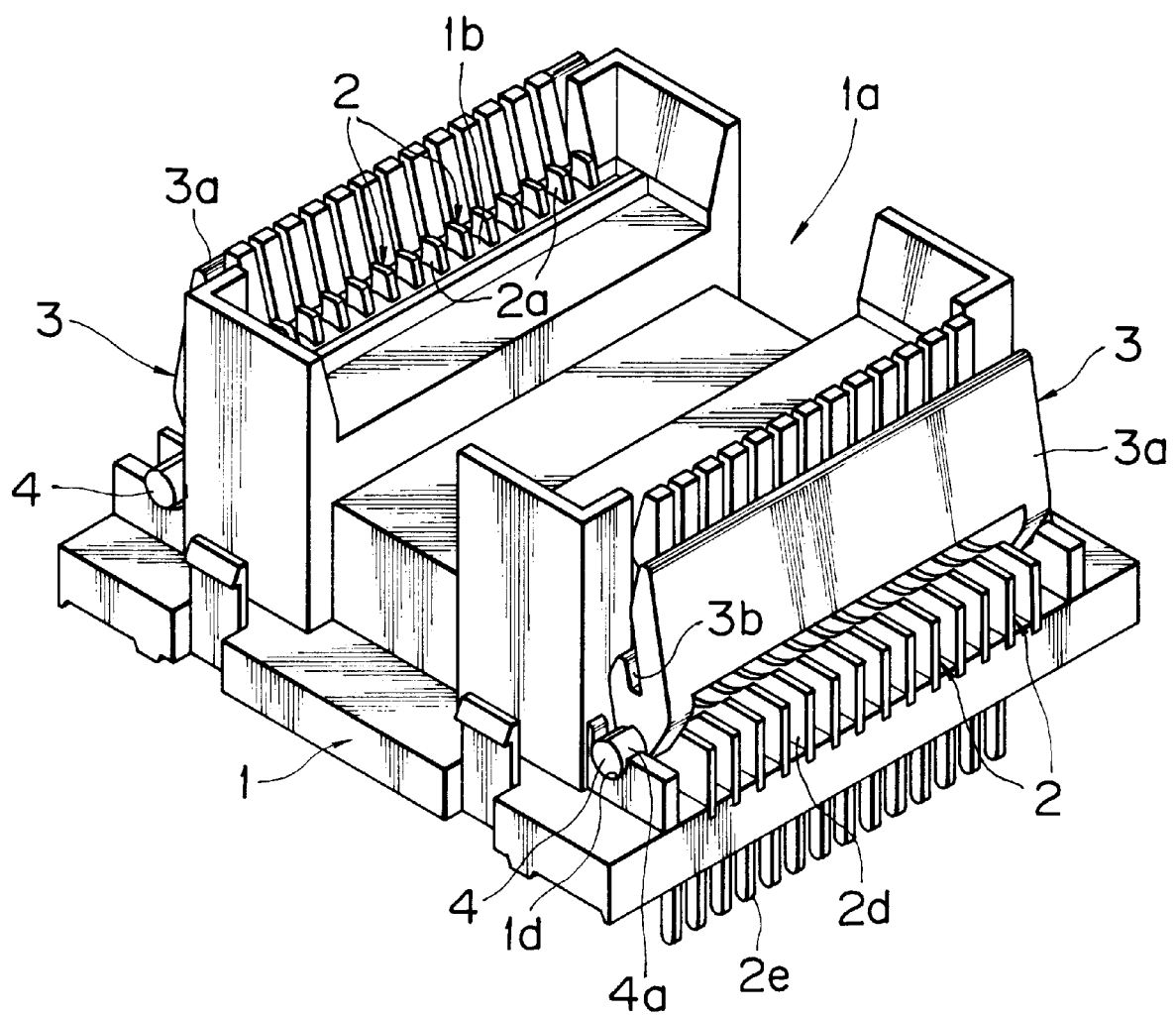
FIG. 2 is a perspective view in a state that a cover for the socket shown in FIG. 1 is removed.
Figure 3:
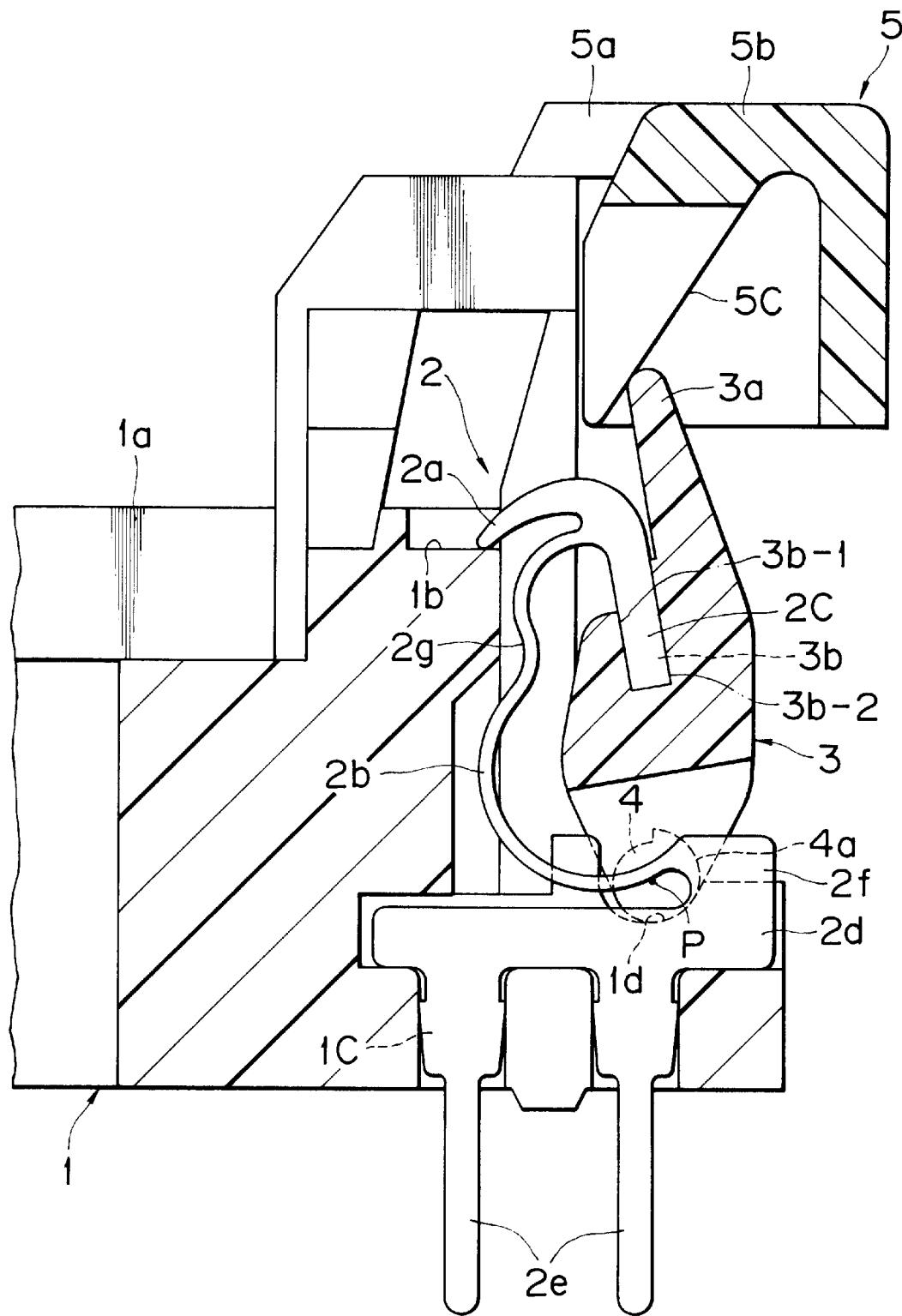
FIG. 3 is a vertical section showing an enlarged important parts.

FIG. 1 is a total perspective view of a socket of this example, FIG. 2 is a perspective view in a state that a cover for the socket is removed, FIG. 3 is a vertical section showing an enlarged important parts, FIGS. 4 through 9 are schematic drawings of important parts each showing an operating state, and FIGS. 10 and 11 are enlarged drawings of important parts each showing a state that the contact part is dislocated. In the drawings, 1 shows a base member, 2 shows a contact, 3 shows an engaging member, 4 shows a cam shaft, 5 shows a cover, and 100 shows an IC package (hereinafter, referred to as "package").

The base member 1 is formed of an insulating material, in the center of which a swelled part of a rectangular shape viewed from the top is provided. In the middle of the swelled part, a recessed part is formed to serve as a receiving space 1a for the package 100. Along the two sides facing the receiving space 1a, a sitting surface 1b on which contacts (leads) 102 of the package 100 received in the receiving space 1a sit is formed, and a plurality of the contacts 2 are arrayed in parallel.

Each of the contacts 2 is formed of a conductive material with a shape as shown in FIG. 3. Namely, the contact 2 is incorporated with a contact part 2a with which a terminal 102 (also referred to as contact 102) of the package 100 received in the receiving space 1a comes into contact, a spring part 2b for energizing the contact part 2a to gain a contact pressure with the foregoing contact 102, and an operating rod 2c for sliding the contact part 2a as described later. Furthermore, flat plates 2d are mounted on the lower part of both sides of the base member 1 and terminals 2e hanging down from the flat plates 2d are inserted into through holes 1c on the base member 1, which are fixed on the base member 1 so as to stand up vertically thereon.

The front end of the contact 2 is formed in a circular arc, and the from inner end is served as the foregoing contact part 2a. The terminals 2e on the lower ends of the contacts 2 are made conductive with a testing circuit not illustrated.

The spring part 2b extends out curving in a shape resembling the letter C, upward from the inner end of a projection 2f provided on the outer edge of the flat plate 2d. The operating load in pushing down the cover 5 and the operating life thereof are maintained in a predetermined condition by the resiliency of the spring, and at the same time, the contact pressure to the contact 102 by energizing the contact part 2a inward downward is obtained in a specific level, so that the package 100 can be clamped reliably.

In this example, a curved part 2g is formed in the opposite direction on the middle part of the spring part 2b so that the spring part 2b can exert a specific resiliency for a long term as well as secure a more reliable sliding operation as described later.

The operating rod 2c is formed to extend downward from the vicinity to the outer end of the foregoing contact part 2a. As described later, the operating rod 2c is inserted into a recessed part 3b of the engaging member 3 vertically slidably with a play, and is pressed inward by the recessed part 3b when the engaging member 3 is swung outward. Accompanying with this pressure, the contact part 2a is energized inward (in the direction for the receiving space 1a), and the engaging member 3 is swung inward. When the contact part 2a comes into contact with the contact 102, the operating rod 2c goes up inside the recessed part 3b to become free from the foregoing energizing force. Accompanying with this, the contact part 2a slide outward (in the opposite direction to the receiving space 1a).

A plurality of the foregoing contacts 2 are arrayed in a column, on the outside of which the engaging member 3 to engage with each of the contacts 2 is swingably provided.

The engaging member 3 is designed to be swung outward by pushing down the cover 5, whereby the contact part 2a of the contact 2 moves outward to come off from the contact 102. The engaging member 3 is supported by a receiving part 1d (a supporting member receiving recessed part in this example) provided on the base member 1, and the receiving part 1d receives to support a (a pivot) 4 inserted across both the right and left ends in the lower end part of the engaging member 3, so that the engaging member 3 can swingably be supported between an inward position and an outward position.

Furthermore, the engaging member 3 is formed to have an operating part 3a rising with a specific angle which slides and comes into contact with a slope 5c provided on the cover 5; whereby, as the cover comes down, the engaging member 3 swings outward, as the cover 5 goes up, the engaging member 3 swings inward.

On the upper part of the engaging member 3, the recessed part 3b is provided in an inner position to the foregoing operating part 3a.

As described above, the recessed part 3b is to allow the operating rod 2c of the contact 2 to slide vertically. In this example, the recessed part 3b is formed in a groove shape in an inner part to the operating part 3a, however, it can be formed in a through hole shape, a recessed shape, and the like.

Figure 4:
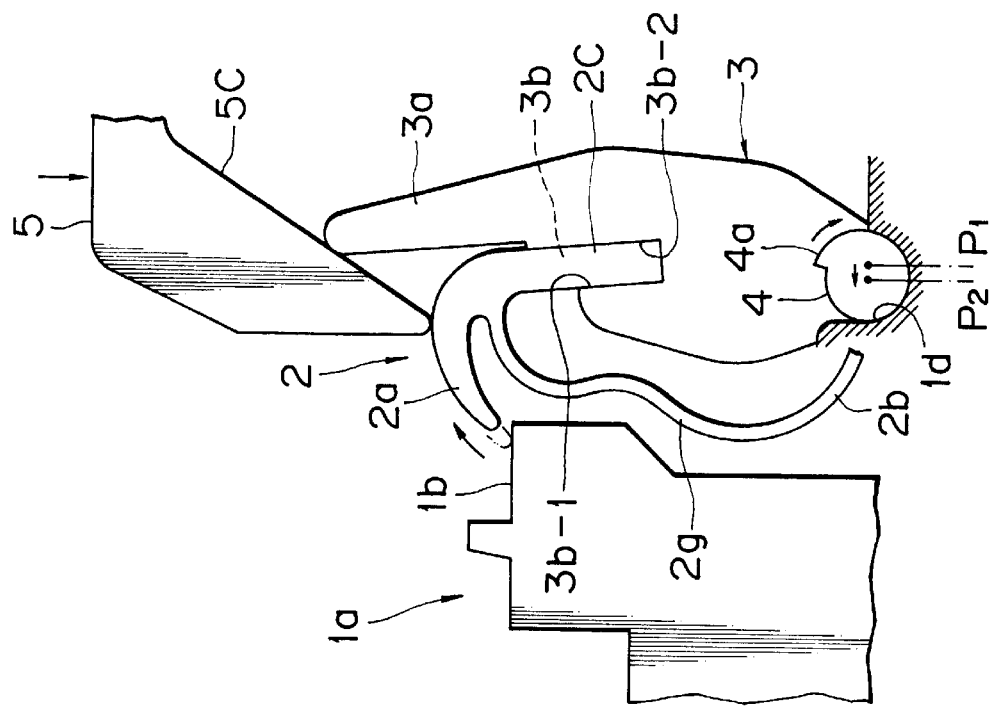
FIG. 4 is a schematic drawing of important parts showing an operating state.
Figure 5:
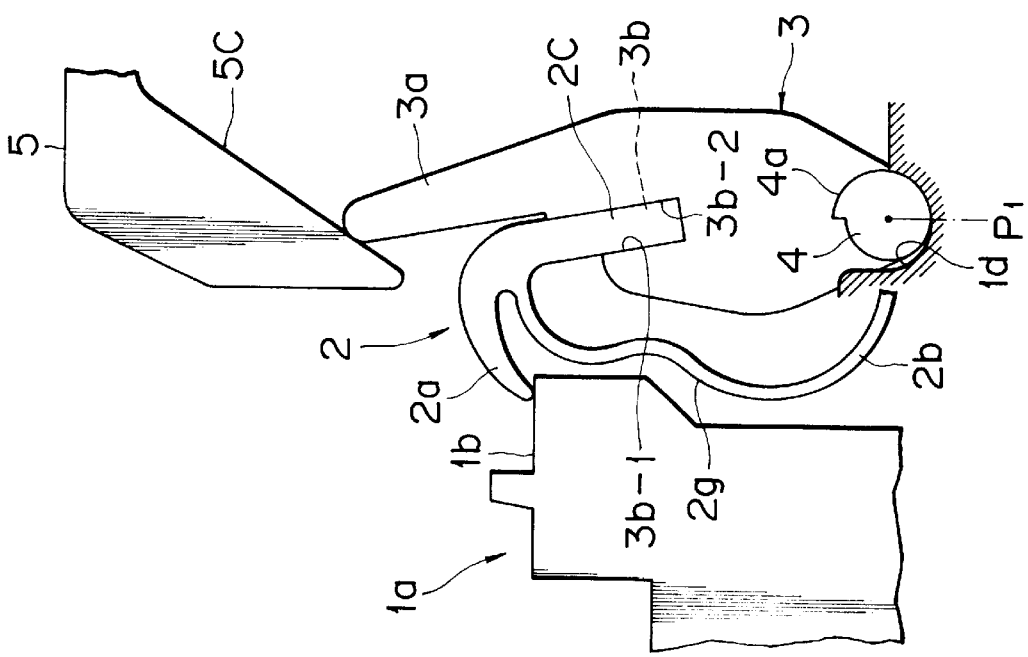
FIG. 5 is a schematic drawing of important parts showing another operating state.
Figure 6:
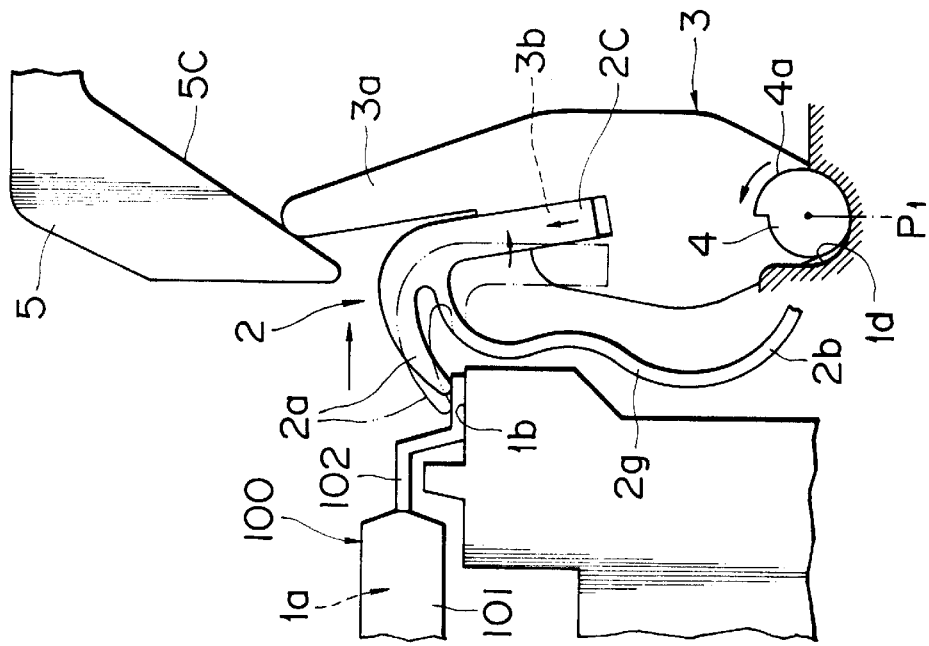
FIG. 6 is a schematic drawing of important parts showing another operating state.
Figure 7:
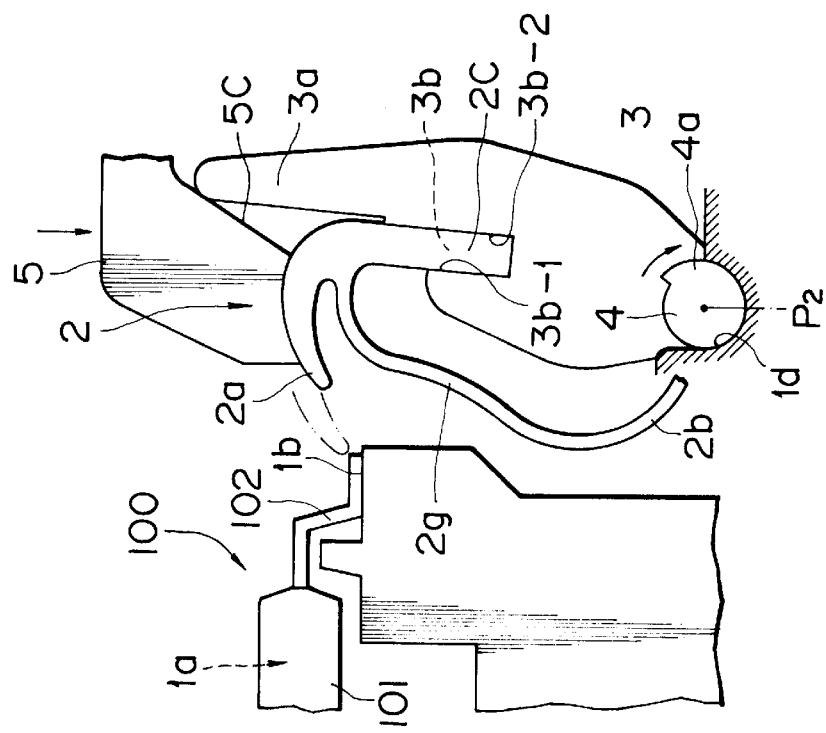
FIG. 7 is a schematic drawing of important parts showing another operating state.

Furthermore, the recessed part 3b nips the operating rod 2c between the inner upper part 3b-1 and the outer lower part 3b-2, when the engaging member 3 swings outward (FIGS. 4–6). This nipping force presses the operating rod 2c inward, and the reaction force energizes the contact part 2a inward (in the direction for the receiving space 1a). Furthermore, the recessed part 3b releases the foregoing nipping force when the engaging member 3 swings inward and the contact part 2a comes into contact with the contact 102 (FIGS. 6 and 7). Thereby, the foregoing contact part 2a is released from being energized inward, and accompanying with this release, the contact part 2a is designed to slide outward (in the opposite direction to the receiving space 1a).

The cam shaft 4 has a cam part 4a on the outer circumferential surface thereof (on the opposite side to the receiving space 1a), and is inserted with a play from the upper part into the foregoing receiving recessed part 1d formed in correspondence with the cam part 4a. The cam shaft 4 stays at an outer position by the resiliency of the contact 2 when the cover 5 is not pushed down; when the cover 5 is pushed down, the cam shaft 4 rotates outward as the engaging member 3 swings outward, and slides inward (in the direction for the receiving space 1a) owing to the shape effect of the cam part 4a.

Namely, the supporting point P moves inward when the engaging member 3 swings outward, and the operating rod 2c is pressed inward by the recessed part 3b as described above to energize the contact part 2a inward.

On the other hand, when the engaging member 3 swings inward, the supporting point P moves outward; and when the contact part 2a comes into contact with the contact 102, the contact pressure is released and the contact part 2a slides outward, swinging slightly.

Furthermore, as the engaging member 3 swings outward, the contact part 2a of the contact 2 moves outward to come off from the contact 102. In the initial movement, as the supporting point P of the engaging member 3 moves from P1 to P2, the contact part 2a goes up virtually vertically (FIG. 8), and then the contact part 2a moves oblique outward to come off from the contact 102 by the swing of the engaging member 3 at the supporting point P2 (FIG. 9).

The cover 5 is provided with a center opening 5a communicating with the receiving space 1a, a mounted part 5b to cover the columns of a plurality of the foregoing contacts 2 on the parts along the two sides facing the opening 5a, and a slope 5c sloping down inward inside of the mounted part 5b. The cover 5 is supported to freely move up and down with the cover 5 covered from above the base member 1, by the slope 5c coming into contact with the foregoing operating part 3a.

The foregoing engaging member 3, cam shaft 4, and cover 5 each are integrally formed.

The package 100, having a construction already known, is provided with a body 101 to be mounted in the foregoing receiving space 1a and a plurality of the contacts (leads) 102 extending in a column from the side of the body 101 in a bent form resembling the letter Z.

Thus, according to the socket of this example constructed as described above, the resiliency of the spring part 2b of the contacts 2 acts in the direction to press the contact part 2a downward; and while the contact pressure to the contact 102 by the contact part 2a, the operating load in pushing down the cover 5, the life and the like are maintained in a specific condition, a reliable nipping force of the package 100 can be obtained.

Operation of attaching and detaching the package 100 to and from the socket of this example will now be described in detail with reference to FIG. 4 through FIG. 9.

In the initial state shown in FIG. 4, since the receiving space 1a has not received the package 100 and the cover 5 is in the lifted position, the contact part 2a of the contact 2 is given a contact pressure with the sitting surface 1b by the resiliency of the spring part 2b.

At that moment, the supporting point P of the engaging member 3 is at the initial supporting point P1.

When the cover 5 is pushed down in this state, as the engaging member 3 swings outward, the contact part 2a of the contact 2 moves outward to come off from the sitting surface 1b, against the resiliency of the spring part 2b. When the engaging member 3 swings outward and the supporting point moves from P1 to P2, the recessed part 3b swings outward while nipping the operating rod 2c between the inner upper part 3b-1 and the outer lower part 3b-2. This nipping force presses the operating rod 2c inward (in the direction for the receiving space 1a) on the vicinity of the branching part to the contact part 2a; and the reaction force energizes the contact part 2a inward on the foregoing vicinity of the branching part. Since the contact part 2a has already moved outward at that moment, practically, the contact part 2a is energized in the left upper direction on the drawing (FIGS. 5 and 6).

Further at that moment, as the supporting point moves from P1 to P2, the contact part 2a goes up virtually vertically in the initial outward movement (refer to FIG. 5), and then comes off from the contact 102, while moving oblique outward by the swing of the engaging member 3 about the supporting position P2 (refer to FIG. 6).

When the package 100 is received in the receiving space 1a in the state of FIG. 6 and then the cover 5 is released from the pushing-down operation, the engaging member 3 swings inward to recover the initial state by the resiliency of the spring part 2b of the contact 2 and the contact part 2a comes into contact with the contact 102. After the contact part 2a come into contact with the contact 102, the operating rod 2c goes up inside the recessed part 3b to be released from the foregoing energizing force (pressing force) by the recessed part 3b, and the contact part 2a slides outward (recover the initial position) while slightly swinging and scrapes the oxide film formed on the surface of the contact 102 by this sliding. Further at that moment, since the operating rod 2c has already been released from the pressure by the recessed part 3b, the contact part 2a does not slide inward when the cover 5 is pushed down next (refer to FIG. 7).

After a conductivity test is done in the state of FIG. 7, the contact part 2a of the contact 2 is spaced from the contact 102 by pushing down the cover 5 to take out the package 100. Here, the contact part 2a goes up virtually vertically (refer to FIG. 8), as the foregoing supporting point moves from P1 to P2 in the initial outward movement as described above. And then, the contact part 2a comes off from the contact 102 while moving oblique outward upward by the swing of the engaging member 3 about the supporting position P2 (refer to FIG. 9).

Therefore, the load to the contact 102 can be reduced to so low a level as possible.

After taking out the package 100 in the state of FIG. 9, releasing the pushing-down operation of the cover 5 allows the resiliency of the spring part 2b of the contact 2 to swing the engaging member 3 inward and to recover the initial state shown in FIG. 4.

FIG. 10 is an enlarged drawing showing a state that the contact part 2a is dislocated in the foregoing operating states in FIG. 4 through FIG. 7. In the drawing, the point S1 through S5 show the front ends of the contact part 2a, that is, they show the parts being practically in contact with the contact 102. S1, S2, S3, and S4-S5 each correspond with FIGS. 4, 5, 6, and 7, respectively.

Figure 8:
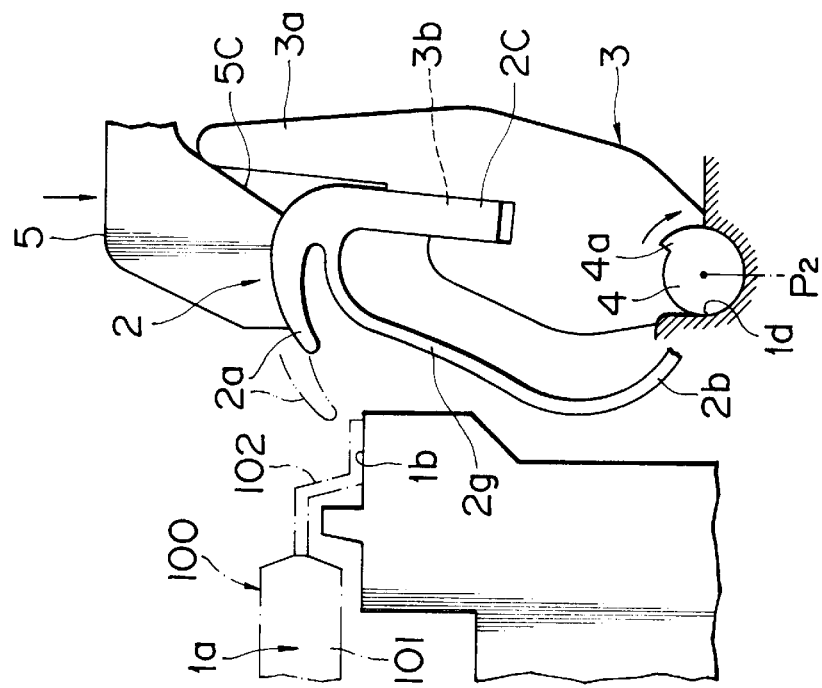
FIG. 8 is a schematic drawing of important parts showing another operating state.
Figure 9:
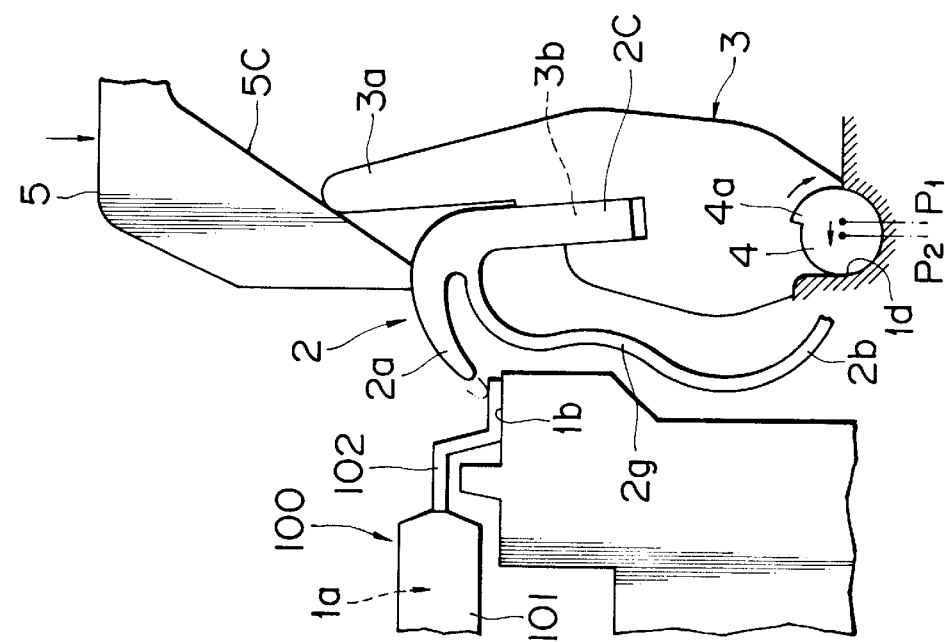
FIG. 9 is a schematic drawing of important parts showing another operating state.
Figure 12:
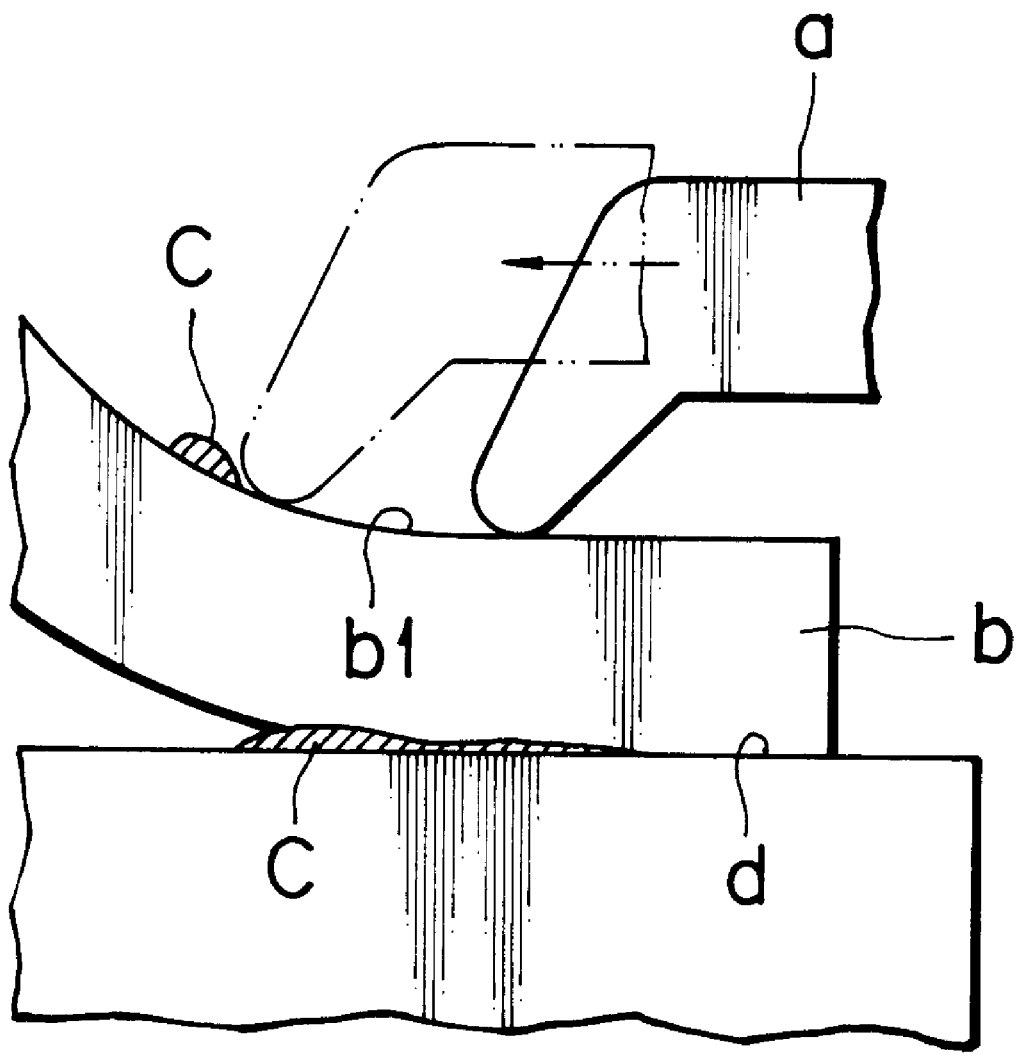
FIG. 12 is an enlarged drawing of important parts of a conventional socket.

FIG. 11 is an enlarged drawing showing a state that the contact parts 2a is dislocated in the operating states in which the operation returns to the initial state shown in FIG. 4 through the state shown in FIGS. 7–9. In the drawing, the point S5 through S8 show the parts being practically in contact with the contact 102 in the same manner as in FIG. 10. S5, S6, S7, and S8 each correspond with FIGS. 7, 8, 9, and 4, respectively.

The embodiment of a socket for an IC package relating to the present invention has been described hereinabove, however, the invention is not limited to this and various modifications and changes are possible within the scope of spirit mentioned in claim 1 and claim 2.

Since the socket for an IC package relating to the present invention is constructed as described above, the contact parts of the foregoing contacts come into contact with the contacts of the IC package while sliding from inside to outside, go up virtually vertically, and afterward move oblique upward to come off from the contacts of the IC package. Therefore, the foregoing contact parts can be brought into a reliable conductivity with the contacts of the IC package, and in addition, the contact pressure is not needed to increase; and therefore, maneuverability can be bettered and the life of the contacts can be extended.

The movement of the contact parts will not deform the contacts of the IC package and produce plating scraps due to an excessive stress.

Accordingly, a reliable conductivity test can be done without damaging an IC package, and the socket for testing an IC package can be provided which has excellence in maneuverability, life, and reliability.

Furthermore, according to the socket relating to claim 2, even a reduced slide to the contacts of the IC package by the contact parts can remove the oxide film on the surface of the contacts, and therefore, a reliable conductivity with a low contact pressure by the contact parts can be achieved, making the aforementioned effect more effective.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope and spirit of the invention as defined by the appended claims.

What is claimed is:

1. A socket for receiving an IC package, the socket comprising:

a base member having side arms, said base member having a receiving space formed therein for receiving the IC package;

a cover overlaying the base member;

a plurality of contacts, each of which has a contact part corresponding to a terminal of the IC package, said contacts giving a contact pressure with said terminal to said contact part, and said contacts being disposed in parallel along said side arms;

engaging members for engaging said contacts, said engaging members being provided outside of both columns of said contacts and being swingably supported about a pivot formed therein, the engaging members being swung outward about the pivot when the cover overlaying the base member is pushed down;

spring parts resiliently biasing said engaging members, said contact parts of the contacts being moved outward against resiliency of the spring parts to disengage the terminals of the IC package as the engaging members are swung outward;

a support member in which the pivot is mounted, said support member having a pivot recess larger than the pivot, said pivot of said engaging members being thereby movable within the pivot recess, about which the engaging member can be swung; and each contact of the IC package being provided with an operating rod extending downward from an outer end of a contact part, each said operating rod being vertically slidably fitted into a recessed part formed on the engaging member and vertically slidable when the cover is pushed down to swing the engaging member outward, moving said pivot inward, and when said cover is released and said engaging member is swung inward, said pivot is moved outward within said pivot recess, said recessed part pressing the operating rod inward to press the contact part inward against the terminals of the IC package, said recessed part then releasing said operating rod to slide the contact part outward along the terminal of the IC package.

2. A socket for an IC package as claimed in claim 1, wherein the outward slide of the contact part when coming into contact with said contact accompanies a slight swing by said contact part.

3. A socket for an IC package having a plurality of terminals, comprising:

a base member having side arms;

a cover overlaying said base member;

a receiving space formed in said base member for receiving the IC package;

a plurality of contact members disposed in parallel along said side arms, each contact member having a contact part corresponding to a terminal of the IC package, a resilient spring part for applying contact pressure from said contact part to said corresponding terminal, and an operating rod extending downward from an outer end of the contact part;

a plurality of engaging members for engaging said contact members, each engaging member being provided outside of a corresponding side arm and having a pivot, about which said engaging member is swingably supported to swing outward when said cover is pushed down, each engaging member further including a recessed part, said operating rod of said contact member being vertically slidably fitted into said recessed part, said contact parts being movable outward by said recessed part pushing said operating rod against a bias of said spring parts, said contact parts thereby being moved away from the terminals of the IC package when said engaging members are swung outward;

a support member in which said pivot is mounted, said support member having a pivot recess larger than the pivot, said pivot being thereby movable within the pivot recess, wherein when the cover is pushed down to swing the engaging member outward, said pivot is moved inward within said pivot recess, and when the cover is released and said engaging member is swung inward, said pivot is moved outward within said pivot recess, said recessed part pressing the operating rod inward to press said contact part inward against the terminals of the IC package, so that said contact part first contacts the terminal of the IC package, said recessed part then releasing said operating rod, so that said operating rod slides up within said recessed part and contact part slides outward along the terminal of the IC package.

4. The socket according to claim 3, wherein said pivot comprises a cam shaft having differing diameters engageable to said pivot recess, said differing diameters formed so that the cam shaft stays at an outer position under the resilience of the contact when the cover is not pushed down, and when the cover is pushed down, the cam shaft rotates outward and slides inward as the engaging member swings outward.

* * * * *